United States Patent [19]

Michel

[11] Patent Number: 5,420,587
[45] Date of Patent: May 30, 1995

[54] TWO STAGE FLASH ANALOG-TO-DIGITAL SIGNAL CONVERTER

[75] Inventor: Jean Y. Michel, Santa Clara, Calif.

[73] Assignee: MicroUnity Systems Engineering, Inc., Sunnyvale, Calif.

[21] Appl. No.: 86,139

[22] Filed: Jul. 1, 1993

[51] Int. Cl.[6] ............................................. H03M 1/14
[52] U.S. Cl. .................................... 341/156; 341/159
[58] Field of Search ................ 341/155, 156, 158, 159

[56] References Cited

PUBLICATIONS

Kattman, et al, A Technique for Reducing Differential Non-linearity Errors in Flash A/D Converters, p. 170, IEEE International Solid-State Circuits Conference (1991).
Dingwall, et al, CMOS 1u, 8b, 50 MHz Averaging Flash A/DC, David Sarnoff Research Center.
Van De Grift, et al, An 8-Bit Video ADC Incorporating Folding and Interpolation Techniques pp. 944–953, IEEE Journal of Solid–State Circuits, vol. SC-22, No. 6, (Dec. 1987).

Primary Examiner—Howard L. Williams
Attorney, Agent, or Firm—Burns, Doane, Swecker & Mathis

[57] ABSTRACT

A two-stage flash analog-to-digital signal converter has a first stage voltage divider network and a set of amplifiers that perform an initial interpolation. The initial interpolation results are directly coupled, i.e. no resistive or capacitive elements, to a second stage comprising a set of comparators having multiple inputs. The multiple inputs of the second stage comparators are weightily coupled to the first stage amplifiers in a manner so as to cause the second stage comparators to generate a digital representation of the analog signal.

13 Claims, 2 Drawing Sheets

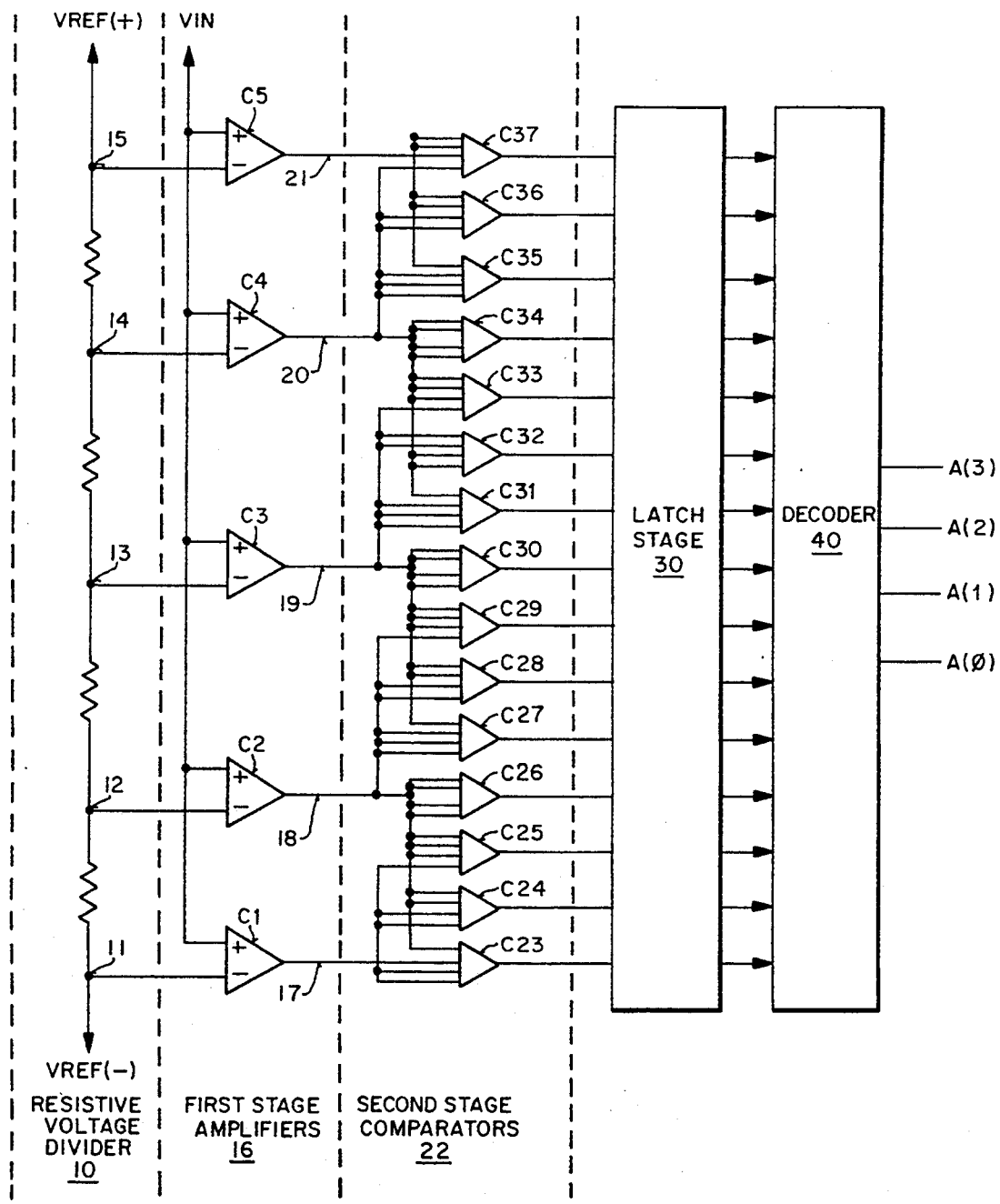
FIG_1

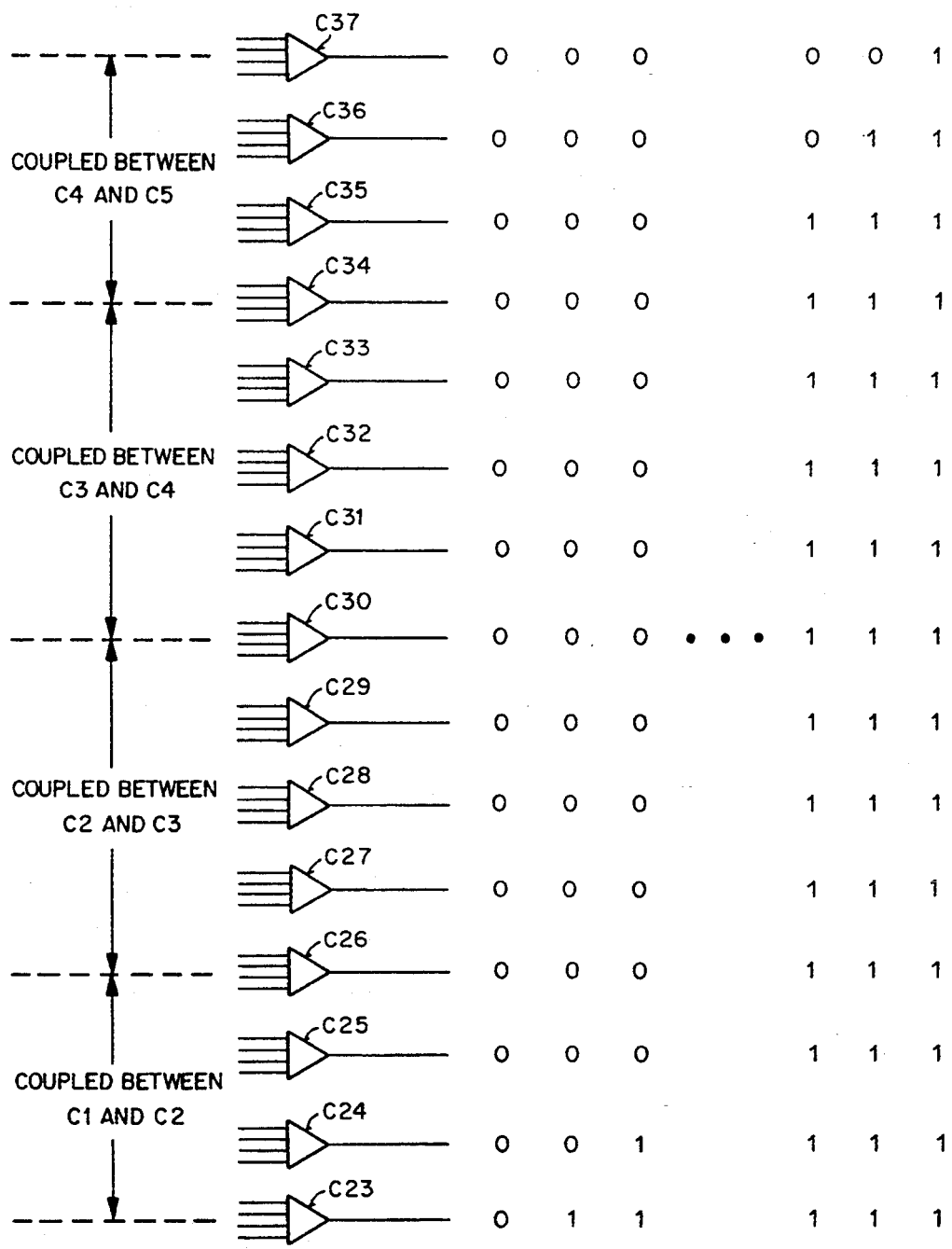

TWO STAGE FLASH ANALOG-TO-DIGITAL SIGNAL CONVERTER

FIELD OF THE INVENTION

The present invention relates to the field of digital signal processing; and particularly to analog to digital signal conversion.

BACKGROUND OF THE INVENTION

In the field of digital systems it is often necessary to convert analog signals into digital signals. One kind of analog-to-digital (A/D) signal converter is referred to as a flash ND converter. A flash A/D converter consists of a voltage divider network which divides a reference voltage into a set of successively increasing voltage points. A set of $2^N-1$, (N being an integer greater than 0), parallel comparators compare each of the voltage points from the divider to an analog voltage, (Vin). The comparators output either a high or low voltage to indicate whether Vin is less than or greater than each voltage point. For example, all of the comparators coupled to voltage points less than Vin output a voltage corresponding to a first logic level and all of the comparators coupled to voltage points greater than Vin output a voltage corresponding to a second logic level.

The $2^N-1$ cumulative first and second logic level signals from the parallel comparators are a digital representation of Vin. Often times this digital representation is fed to a decoder and converted to an N-bit binary digital signal. For an N-bit converter, there are $2^N$ possible binary codes for describing Vin. The number of bits in the digital word that represents Vin is referred to as the resolution of an A/D converter. For example an A/D converter having a resolution of 4-bits can represent the sampled voltage level in $2^4$ or 16 possible binary words. The more bits of resolution the converter can provide, the more accurately it can represent the analog signal.

In addition to the resolution, the flash converter as described above is also characterized by its least significant bit (LSB) voltage. The LSB voltage is equal to the voltage difference between two contiguous voltage points established by the voltage divider network. It directly relates to the resolution of the converter; i.e. small LSBs increase the resolution of the converter. In video A/D converters, the LSB is typically in the millivolt range.

One problem with the flash converter described above is that the comparators are typically non-ideal due to processing fluctuations. As a result, they have built in error voltages, referred to as the off-set voltage (Vos) of the comparator. The ratio of the Vos of a comparator and the converter's LSB defines the differential non-linearity (DNL) of the converter, i.e. DNL=Vos/LSB. If the DNL of a flash A/D converter is greater than $\pm 0.50$ the converter may lose codes. For example, an N-bit converter generating $2^N$ possible codes may only be able to generate $2^N-1$ codes (or less) if its DNL is too large. As LSB becomes smaller, such as in video applications, this problem can become even more exacerbated. However, small LSBs are desirable since they provide increased resolution One prior art converter that reduces DNL values while retaining high resolution is a two-stage flash A/D converter. The first stage of this type of converter includes a first voltage divider network and a first stage of parallel comparators that function to perform an initial interpolation step. In addition, the first stage comparators amplify the results of this initial interpolation. In this design, the number of voltage points (provided by the first voltage divider network) and the number of first stage comparators are significantly reduced when compared with the single stage flash converters. As a result, LSB values are larger and DNL values are reduced for this initial first stage comparison. The second stage includes a second voltage divider network and a second set of comparators. The second voltage divider network further divides the voltage outputted by the first stage comparators. Since the first stage comparators amplify their output voltages the LSB of the second voltage divider network is still large enough so that second stage DNL values are in an acceptable range. The second stage voltage divider network is coupled to the second set of comparators. This set of comparators perform a final interpolation of Vin by outputting a voltage corresponding to either a high or low logic level depending on whether the summation of each of the comparators input voltage is positive or negative. The output of the second set of comparators gives the digital representation of Vin.

The first and second voltage dividers in the two-stage converter design described above is typically made-up of either resistive or capacitive elements. If resistors are utilized, the first stage resistors have very low ohmic values (typically around 4 ohms for an 8-bit converter). As a result, they can be fabricated out of metal lines and do not take up much space. However, second stage resistors must have large enough ohmic values (typically 1 Kohm or more for an 8-bit converter) to be driven by the first stage comparators.

In fabricating most digital very large scale integrated (VLSI) circuit designs, a complimentary metal oxide silicon (CMOS) or a bipolar complimentary metal oxide silicon (BiCMOS) process is employed. In general, these processes do not include processing steps for fabricating capacitors or high value resistors such as that required for the two-stage converter. As a result, to fabricate converters requiring high resistive values it is necessary to include additional steps in the standard CMOS or BiCMOS processes. In addition, capacitors or large value resistors take-up large areas in the integrated circuit layout design.

The present invention is a two-stage flash AID converter which obviates the need for large resistive or capacitive elements. In the present invention's converter design, the first stage comparators are directly coupled to the inputs of multiple input second stage comparators. As a result, the size of the present invention's converter is significantly reduced. In addition, the present invention's converter can be fabricated utilizing standard CMOS or BiCMOS processes without the addition of steps to accommodate large resistors or capacitors. Finally, the present invention's converter design reduces the current loading on the output of the first stage of comparators by eliminating the second voltage divider network.

SUMMARY OF THE INVENTION

A two-stage flash A/D converter is described. The present invention's converter design obviates a previously utilized capacitive/resistive stage.

The present inventions converter includes a voltage divider network that divides a reference voltage into a first set of voltage points. Each of these voltage points are coupled to one input of a first set of differential amplifiers. The second input of each of the differential amplifiers is coupled to the analog voltage (Vin) to be converted. The output of the first set of differential amplifiers is a second set of voltage points. Each of these voltage points correspond to the amplified difference between each of the first set of voltage points and Vin.

In the case of an N-bit converter, the second set of voltage points are directly coupled to a second stage of $2^N-1$ multiple-input comparators having $2^M$ inputs; where N and M are integers and $N>0$ and $0<M<N$. Each of the multiple input second stage comparators function such that when the summation of the voltages on its inputs is positive then the comparator outputs a voltage corresponding to a first logic level. Conversely, the comparator outputs a voltage corresponding to a second logic level when the summation of the voltages on its inputs is negative.

The multiple input comparators in the second stage are divided into groups; each group being directly coupled between first and second contiguous voltages from the second set of voltages. The manner in which the groups are directly coupled is such that a group of X inputs of the multiple input comparator is coupled to the first contiguous voltage and a group of Y inputs of the same multiple input comparator are coupled to the second contiguous voltage where $X+Y=2^M$ and X and Y are integers. Further, each of the multiple input comparators within a particular group have different X and Y values. Directly coupling the first and second contiguous voltages to the inputs of groups of multiple input comparators in this manner effectively weights the input of the comparators within each group without using resistive or capacitive divider elements.

In the preferred embodiment, each of the outputs of the second stage comparators are coupled to a clocked latch stage comprising $2^N-1$ latches. The outputs of the latches are subsequently fed into a decoder that decodes the $2^N-1$ signals into an N-bit binary digital signal.

BRIEF DESCRIPTION OF THE DRAWINGS

FIG. 1 illustrates an embodiment of the two stage analog-to-digital converter of the present invention.

FIG. 2 illustrates the digital output code of the second stage comparators shown in the FIG. 1 embodiment of the digital converter of the present invention.

DETAILED DESCRIPTION

An improved two-stage flash A/D converter is disclosed. In the following description, numerous specific details are set forth, such as specific resistive and voltage values, number of bits, etc., in order to provide a thorough understanding of the present invention. It will be obvious, however, to one skilled in the art that these specific details need not be employed to practice the present invention. In other instances, well-known comparator theory is not described in detail in order not to unnecessarily obscure the present invention.

FIG. 1 shows one embodiment of the two-stage flash A/D converter of the present invention. Resistive voltage divider 10 is coupled between two reference voltages VREF(+) and VREF(−). Typically, VREF(−) is 0.0 volts, or ground. Each of the resistors in voltage divider 10 have the same ohmic value so that the voltage potential between voltage points 11–12, 12–13, 13–14, and 14–15 are equal. For an N-bit converter, $2^{(N-M)}$ resistors are utilized; where N and M are integers, $N>0$, and, $0<M<N$. For the embodiment shown in FIG. 1, $M=2$ and $N=4$, (i.e. for a 4-bit converter). As a result, $2^{(4-2)}$, or 4 resistors are utilized.

First stage differential amplifiers 16 basically function to do an initial interpolation of Vin with respect to a first set of relatively large voltage increments, i.e. the voltage points established by divider 10, and then amplify the results of this interpolation. The advantage of doing this initial interpolation is that the Vos of each of the first stage differential amplifiers is relatively small when compared to the LSB voltage. As a result the DNL for this stage is in an acceptable range.

Referring to FIG. 1, voltage points 11–15 are coupled to the negative input of each of first stage differential amplifiers 16. The positive input of each of the first stage differential amplifiers is coupled to Vin, i.e. the analog voltage that is to be converted.

First stage differential amplifiers 16 perform the initial interpolation by amplifying the difference between Vin and each of the voltage points in voltage divider network 10. As an example, the output potential of C1 is equal to A(Vin−V11); where A is the gain of differential amplifier C1. Table 1 shows the output voltages for each of the first stage differential amplifiers.

TABLE 1

| Amplifier | Vout |
| --- | --- |
| C(1) | V17 = A(Vin − V11) |
| C(2) | V18 = A(Vin − V12) |
| C(3) | V19 = A(Vin − V13) |
| C(4) | V20 = A(Vin − V14) |
| C(5) | V21 = A(Vin − V15) |

As can be seen, the results of this calculation will be either a positive or negative number, depending on whether Vin is greater than or less than V11−V15. For instance, if Vin is greater than V13 but less than V14, then the output of C3, V19, is some positive potential and all of the differential amplifiers above it, i.e. C4 and C5, output some negative voltage. It also follows that all of the differential amplifiers below C3, i.e. C1 and C2, output some positive potential.

It should be noted that the output potentials of contiguous first stage differential amplifiers represent initial interpolation ranges. For instance, the outputs of contiguous differential amplifiers C1 and C2 represent the voltage range between V11 and V12. The range between V12 and V13 is represented by the output potential between C2 and C3; the range between V13 and V14 is represented by the outputs of C3 and C4; and the range between V14 and V15 is represented by the outputs of C4 and C5.

The output potentials from each pair of contiguous first stage differential amplifiers are coupled to groups of second stage comparators 22. These multiple-input comparators function to further interpolate the initial interpolation ranges. In other words, the second stage comparators perform a "fine tuning" interpolation.

Referring to FIG. 1, the output voltages from C1 and C2 (V17 and V18) are coupled to multiple-input comparators C23–C26, the output voltages from C2 and C3 (V18 and V19) are coupled to C26–C30, the output voltages from C3 and C4 (V19 and V20) are coupled to C30–C34, and finally the output voltages from C4 and C5 (are coupled to C34–C37).

For an N-bit converter, $2^{N-1}$ second stage multiple-input comparators having $2^M$ inputs are employed. The outputs of two contiguous first stage differential amplifiers are directly coupled to the multiple inputs of each of the second stage comparators within a particular group so as to weight the total input voltage for each comparator in the group differently in order to perform a linear interpolation. Referring to FIG. 1, the output voltages from C1 and C2 are coupled such that all four of the inputs of C26 are coupled to V18; C25 has three inputs coupled to V18 and one input coupled to V17; C24 has two input coupled to V18 and two inputs coupled to V17 and finally, C23 has one input coupled to V18 and three inputs coupled to V17.

In general, $2^M+1$ second stage comparators are coupled between each set of contiguous first stage differential amplifiers. As can be seen in the 4-bit converter of the present invention shown in FIG. 1, 5 second stage comparators are coupled between differential amplifier pairs C2/C3 and C3/C4. However, it should be noted in FIG. 1 that only 4 second stage comparators (instead of 5) are included in the top and bottom groups, i.e. between C1/C2 and C4/C5. The reason this is done, is that if 5 comparators are utilized in the top and bottom second stage comparator groups, the top and bottom most comparators only give overflow information. In other words, these extra comparators indicate if Vin is greater than VREF(+) or less than VREF(−). They do not give any digital interpolation information. Thus, in the embodiment shown in FIG. 1, the top and bottom most comparators are excluded. However, it should be obvious that other embodiments of the present invention may include the top and bottom most second stage comparators.

The input voltage for each of the $2^M+1$ second stage comparators can be generally defined by:

$$Vin(2^M+1-m)th\ comparator=(2^M-m)\times Vout_{Ca}+(m)\times Vout_{Cb} \qquad \text{Eq. 1}$$

where Ca and Cb are two contiguous first stage differential amplifiers in an N-bit converter and m is an integer ranging from 0 to $2^M$. For instance, in the case of the embodiment of the present invention shown in FIG. 1, where the fifth comparator between C2 and C3 is C30, the fourth is C29, the third is C28, the second is C27, and the first is C26, Vin for C26–C30 is:

$Vin_{C30}=Vin_{5th}$
 comparator$=(4\times Vout_{C3})+(0\times Vout_{C2}); (2^M=4, m=0)$ $Vin_{C29}=Vin_{4th}$
 comparator$=(3\times Vout_{C3})+(1\times Vout_{C2}); (2^M=4, m=1)$ $Vin_{C28}=Vin_{3rd}$
 comparator$=(2\times Vout_{C3})+(2\times Vout_{C2}); (2^M=4, m=2)$ $Vin_{C27}=Vin_{2nd}$
 comparator$=(1\times Vout_{C3})+(3\times Vout_{C2}); (2^M=4, m=3)$ $Vin_{C26}=Vin_{1st}$
 comparator$=(0\times Vout_{C3})+(4\times Vout_{C2}); (2^M=4, m=4)$ where $C_a=C2$ and $C_b=C3$.

The multiple input second stage comparators sum all of their input voltages and if the summation of the voltages equals a positive potential then the comparators output a voltage corresponding to a first logic level. If the summation of the voltages equals a negative potential, the comparators output a voltage corresponding to a second logic level.

In the case where the outputs of two contiguous first stage differential amplifiers are positive, all of the second stage comparators coupled between them have positive summations and thus output a first logic level. For example, if the output voltages of C4 and C5 are both positive, then all of the input voltages to comparators C34–C37 are positive. Thus, C34–C37 output logic signals indicating a positive summation. This indicates that Vin is more than the voltage range defined by C4 and C5. Similarly, if both of the outputs of C4 and C5 are negative, all the input voltages to comparators C34–C37 are negative, resulting in negative summations. As a result, C34–C37 output a second logic level indicating that Vin is less than the ranges defined by C4 and C5.

Second stage "fine tuning" interpolation of Vin occurs when one of the output voltages of a contiguous pair of first stage differential amplifiers is positive and the other is negative. For example, If the output of C4 is negative and the output of C3 is positive, a portion of the inputs of C34–C37 is coupled to a positive voltage and a portion is coupled to a negative potential. As a result, C34–C37 linearly interpolate Vin between the voltage range defined by C3 and C4.

For the 4 bit A/D converter shown in FIG. 1, $2^N$, or 16 possible codes are available to digitally describe Vin, i.e. ranging from 0–15. FIG. 2 shows the 16 output conditions ranging from 0–15 for the second stage comparators. These codes are coupled to decoder 40 and are converted into a 4-bit binary digital signal.

In the embodiment shown in FIG. 1, a 4-bit converter having 5 first stage amplifiers and 15 second stage comparators each having 4 inputs are utilized; N=4 and M=2. It should be noted that for the converter of the present invention, as the number of inputs to the second stage comparators is increased, the number of first stage amplifiers are decreased. For instance a 4-bit converter of the present invention that has 15 second stage comparators each having $2^3$ or 8 inputs has only 3 first stage differential amplifiers. The advantage of reducing the number of first stage differential amplifiers is that current and capacitance loading of the converter input is reduced.

One preferred embodiment of the present invention is an 8-bit converter having 65 first stage amplifiers and 255 second stage comparators; each of the second stage comparators having 4 inputs; M=2 and N=8.

It can be seen in the embodiment shown in FIG. 1 that the outputs of second stage comparators 22 are coupled to latch stage 30. Latch stage 30 comprises $2^{N-1}$ individual latches coupled to each of the second stage comparators. Each latch is clocked so that the output of the second stage comparators are sampled at certain specified time intervals. The latched output signals are coupled to decoder 40, and are converted to a binary 4-bit word representing Vin comprising bits A(0)–A(3).

Although the present invention has been described in conjunction with certain embodiments, it is appreciated that the invention may be implemented in a variety of other ways. By way of example, the embodiment of the present invention shown in FIG. 1 is a 4-bit converter. This design can easily be expanded to any number of bits and any range of interpolation, $(2^M)$. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

Thus, the present invention offers an improved design for two-stage flash A/D converters.

I claim:

1. An apparatus for convening an input analog voltage signal into a corresponding digital signal comprising:
   a means for dividing a reference voltage potential coupled between first and second nodes into a first set of voltages;
   a plurality of amplification means for providing a second set of voltages, each of said second set of voltages being the amplified difference between said input analog voltage signal and each of said first set of voltages;
   a plurality of means for summing and comparing voltages, each of said summing and comparing means having multiple inputs and an output said plurality of summing and comparing means being grouped into sets of summing and comparing means each of said sets of summing and comparing means being directly coupled between first and second contiguous voltages within said second set of voltages;
   wherein each of said summing and comparing means within said each of said sets of summing and comparing means has a first group of its multiple inputs directly coupled to said first contiguous voltage and has a second group of its multiple inputs directly coupled to said second contiguous voltage such that said each of said summing and comparing means within each of said sets of summing and comparing means has a different cumulative input voltage coupled to its multiple inputs.

2. The converter as described in claim 1 further comprising a means for decoding said digital signal so as to convert it into a binary digital N-bit word, where N is an integer greater than 0.

3. The converter as described in claim 2 wherein the total number of said each of said summing and comparing means is equal to $2^N-1$, said each of said summing and comparing means having $2^M$ inputs, where M is an integer and $0<M<N$.

4. The converter as described in claim 3 wherein said plurality of amplification means and said plurality of summing and comparing means are fully differential amplifiers.

5. The converter as described in claim 4 wherein the total number of said amplification means is equal to $2^{(N-M)}+1$.

6. The converter as described in claim 5 wherein said output of said each of said summing and comparing means is coupled to one of a plurality of latches, said plurality of latches being clocked so as to sample said digital signal at specified time intervals, said plurality of latches being coupled between said plurality of summing and comparing means and said decoding means.

7. The converter as described in claim 6 wherein said converter is fabricated utilizing a complimentary metal oxide silicon (CMOS) process.

8. The converter as described in claim 7 wherein said converter is fabricated utilizing a bipolar complimentary metal oxide silicon (BiCMOS) process.

9. An apparatus for converting an input analog voltage signal into a corresponding binary digital signal having N bits where N is an integer greater than 0, said apparatus comprising:
   $2^{(N-M)}$ resistive elements having the same ohmic value coupled in series between first and second reference potentials for providing a first set of voltages, where M is an integer and $0<M<N$;
   $2^{(N-M)}+1$ differential amplifiers each having a first input coupled to said input analog voltage and a second input coupled to one of said first set voltages, said $2^{(N-M)}+1$ differential amplifiers outputting a second set of voltages each corresponding to the amplified difference between said input analog voltage signal and each of said first set of voltages;
   $2^N-1$ multiple input comparators, each of said $2^N-1$ multiple input comparators having $2^M$ inputs and an output, said $2^N-1$ multiple input comparators being divided into sets of multiple input comparators, each of said sets of multiple input comparators being directly coupled between first and second contiguous voltages within said second set of voltages;
   wherein each of said multiple input comparators within each of said sets of multiple input comparators has a first group of its multiple inputs directly coupled to said first contiguous voltage and has a second group of its multiple inputs directly coupled to said second contiguous voltage such that said each of multiple input comparators within each of said sets of multiple input comparators has a different cumulative input voltage coupled to its multiple inputs;
   wherein said $2^N-1$ multiple input comparators output a $2^N-1$ bit digital signal representing said input analog voltage signal depending on said different cumulative input voltage of said each of said $2^N-1$ multiple input comparators;
   a decoder for converting said $2^N-1$ bit digital signal into a corresponding binary digital signal having N bits.

10. The converter as described in claim 9 wherein said differential amplifiers and said $2^N-1$ multiple input comparators are fully differential amplifiers.

11. The converter as described in claim 10 wherein said output of said each of said $2^N-1$ multiple input comparators is coupled to one of a plurality of latches, said plurality of latches being clocked so as to sample said digital signal at specific time intervals, said plurality of latches being coupled between said $2^N-1$ multiple input comparators and said decoder.

12. The converter as described in claim 11 wherein said converter is fabricated utilizing a complimentary metal oxide silicon (CMOS) process.

13. The converter as described in claim 12 wherein said converter is fabricated utilizing a bipolar complimentary metal oxide silicon (BiCMOS) process.

* * * * *